(12) United States Patent
Gazzano et al.

(10) Patent No.: US 12,243,674 B2
(45) Date of Patent: Mar. 4, 2025

(54) MOTHERBOARD COMPRISING A PLANAR TRANSFORMER EQUIPPED WITH COMPONENTS AND METHOD FOR ASSEMBLING SUCH A MOTHERBOARD

(71) Applicant: MBDA FRANCE, Le Plessis-Robinson (FR)

(72) Inventors: Charlotte Gazzano, Le Plessis-Robinson (FR); Guilhem Rafray, Le Plessis-Robinson (FR)

(73) Assignee: MBDA FRANCE (FR)

( * ) Notice: Subject to any disclaimer, the term of this patent is extended or adjusted under 35 U.S.C. 154(b) by 250 days.

(21) Appl. No.: 17/922,888

(22) PCT Filed: Apr. 23, 2021

(86) PCT No.: PCT/FR2021/050709
§ 371 (c)(1),
(2) Date: Nov. 2, 2022

(87) PCT Pub. No.: WO2021/224559
PCT Pub. Date: Nov. 11, 2021

(65) Prior Publication Data
US 2023/0170128 A1 Jun. 1, 2023

(30) Foreign Application Priority Data
May 4, 2020 (FR) ..................... 2004382

(51) Int. Cl.
*H01F 27/24* (2006.01)
*H01F 27/29* (2006.01)
*H05K 1/14* (2006.01)
(52) U.S. Cl.
CPC .......... *H01F 27/24* (2013.01); *H01F 27/292* (2013.01); *H05K 1/141* (2013.01); *H05K 1/144* (2013.01);
(Continued)

(58) Field of Classification Search
CPC ....... H01F 27/24; H01F 27/292; H05K 1/141; H05K 1/144; H05K 2201/041;
(Continued)

(56) References Cited

U.S. PATENT DOCUMENTS 6,069,548 A 5/2000 Baarman et al.
6,335,671 B1 1/2002 Roessler et al.
(Continued)

FOREIGN PATENT DOCUMENTS

EP 0741395 A1 11/1996
EP 0896419 A2 2/1999
(Continued)

OTHER PUBLICATIONS

International Search Report with English Translation and Written Opinion for PCT/FR2021/050709, dated Nov. 15, 2021, pp. 1-12.

Primary Examiner — Nathan Milakovich
(74) Attorney, Agent, or Firm — Dickinson Wright PLLC (57) ABSTRACT

Disclosed is a motherboard comprising at least one printed circuit board (PCB), referred to as the motherboard PCB, at least one planar transformer, which is mounted on the motherboard PCB, and a plurality of electronic components, which are also mounted on the motherboard PCB. The planar transformer comprises at least one printed circuit board with windings and a connection interface, a magnetic core arranged on the printed circuit board so as to interact with the windings, and at least one electronic component mounted on the printed circuit board.

18 Claims, 3 Drawing Sheets

(52) U.S. Cl.
CPC . *H05K 2201/041* (2013.01); *H05K 2201/086* (2013.01); *H05K 2201/09181* (2013.01); *H05K 2201/1003* (2013.01)

(58) Field of Classification Search
CPC ... H05K 2201/086; H05K 2201/09181; H05K 2201/1003
See application file for complete search history.

(56) References Cited

U.S. PATENT DOCUMENTS

| | | |
|---|---|---|
| 2002/0189083 A1 | 12/2002 | Matsumoto et al. |
| 2007/0296533 A1* | 12/2007 | Springett ............ H01F 27/2804 336/200 |

FOREIGN PATENT DOCUMENTS

| | | | |
|---|---|---|---|
| EP | 1085535 | A1 | 3/2001 |
| EP | 1723657 | A1 | 11/2006 |

* cited by examiner

MOTHERBOARD COMPRISING A PLANAR TRANSFORMER EQUIPPED WITH COMPONENTS AND METHOD FOR ASSEMBLING SUCH A MOTHERBOARD

CROSS-REFERENCE TO RELATED APPLICATION(S)

This present application is a national stage application of International Patent Application No. PCT/FR2021/050709, filed Apr. 23, 2021, which claims priority to French Patent Application No. 2004382, filed May 4, 2020, the disclosures of which are hereby incorporated by reference in their entireties.

TECHNICAL FIELD

The present invention relates to a planar transformer equipped with components, a motherboard comprising such a planar transformer and a method for assembling such a motherboard.

PRIOR ART

This planar transformer and/or this motherboard can be used for many different applications, both in equipment deployed in stationary installations and in onboard equipment on movable platforms. In this case, as an illustration, the planar transformer can be used in land, sea or air vehicles, or in weapon systems and in particular in missiles. To do so, such a planar transformer must not be sensitive to the severe mechanical environments likely to be encountered in such applications and must be able to easily adapt to the required constraints of mass, volume and mechanical interfaces.

Such a planar transformer generally comprises at least one magnetic core, and turns which are arranged around this magnetic core, which form a primary winding and a secondary winding and which cooperate with the magnetic core to form an energy converter (e.g. a direct/direct, direct/alternating or alternating/direct type voltage converter). The planar transformer also comprises connection means allowing for mounting this planar transformer on an electronic board.

A device (or transformer) of this type is known from the document EP-0 741 395, which comprises turns produced on a printed circuit board, around which a ferrite magnetic core is positioned. This device can be mounted on an electronic board thanks to conductive studs placed on the electronic board. It is welded on these studs. Such a device is bulky. Indeed, the printed circuit board of the transformer is only used to create the turns. It is therefore not suitable for applications with high overall dimension constraints.

The document EP-1 085 535 also describes such a device (or transformer) which comprises a stack of basic turns and high current turns, around which a ferrite magnetic core is positioned. This device has high current conducting terminals and connecting spikes. These connection means allow the device to be brazed to an electronic board. This device has the same disadvantages as the previous one and is therefore not suitable for applications that have strong overall dimension constraints. Moreover, such a device requires several assembly operations, as it requires different elements to form the turns of the transformer.

We also know, from the document U.S. Pat. No. 6,335,671, a device (or transformer) of this type which comprises several conductive sheets coated with an insulator (constituting the turns), around which is positioned a ferrite magnetic core. This device has connection spikes terminated by conductive terminals, allowing the device to be brazed to an electronic board. This device has the same disadvantages as the previous devices and is therefore not suitable for applications with high overall dimension constraints. On the other hand, such a device also requires several assembly operations, as it requires several elements to form the turns of the transformer.

Furthermore, a magnetic device for mounting on a planar surface comprising a printed circuit board is known from the document EP-1 723 657.

DESCRIPTION OF THE INVENTION

The object of the present invention is to remedy at least some of the aforementioned disadvantages, and is in particular intended to optimize the overall dimension requirement. It concerns a planar transformer comprising at least one printed circuit board provided with turns and a connection interface, as well as a magnetic core arranged on the printed circuit board so as to cooperate with the turns.

According to the invention, said planar transformer further comprises at least one electronic component mounted on the printed circuit board.

In a preferred embodiment, said planar transformer comprises a plurality of electronic components mounted on the printed circuit board.

Thus, thanks to the invention, one or more electronic components (and preferably the maximum number of electronic components possible) are provided directly on the printed circuit board of the planar transformer. This allows not to lose surface on the planar transformer, and to gain some on a motherboard comprising such a planar transformer as specified below.

These characteristics allow to optimize the overall dimension of the planar transformer and/or of a motherboard equipped with such a planar transformer. This planar transformer has, in addition, other advantages specified below.

Preferably, the printed circuit board (of the planar transformer) comprises a plurality of superimposed layers, the turns are arranged on layers (of said plurality of superimposed layers) other than an upper layer, and said electronic components are arranged on said one upper layer. This allows to make the turns for operation with the magnetic core (in layers other than the upper layer), while leaving space for mounting the electronic component or components (on the upper layer).

In a particular embodiment, the electronic component or components (mounted on the printed circuit board of the planar transformer) are part of a power cell used for the operation of the planar transformer.

The connection interface of the planar transformer can be produced by any usual means. However, in one particular embodiment, the connection interface comprises metallizations.

The present invention also relates to a motherboard which comprises a printed circuit board referred to as motherboard and at least one planar transformer as described above, which is mounted on this motherboard printed circuit board.

Preferably, the motherboard further comprises a plurality of electronic components mounted on the motherboard printed circuit board.

The arrangement of electronic components on the planar transformer, preferably by providing a maximum of electronic components directly on said printed circuit board of the planar transformer, allows to lose no surface on the planar transformer and to gain some on the motherboard (receiver) on which would otherwise have had to be mounted these electrical components.

The present invention further relates to a method for assembling a motherboard as described above.

According to the invention, said assembly method comprises at least the following steps:
- a production step form a planar transformer comprising at least one printed circuit board provided with turns and a connection interface;
- a set of mounting steps comprising:
  a. a first mounting step for mounting electronic components on the printed circuit board of the planar transformer;
  b. a second mounting step for mounting electronic components on the printed circuit board of a motherboard; and
  c. a third mounting step for mounting the planar transformer on the printed circuit board of the motherboard via the connection interface; and
- an auxiliary mounting step for mounting a magnetic core on the printed circuit board of the planar transformer so as to cooperate with the turns.

In a first embodiment, said steps are implemented in the following order: the production step, the set of mounting steps, the auxiliary mounting step.

In a first variant embodiment of this first embodiment, the steps of the set of mounting steps are implemented sequentially, in one of the following orders:
- the first mounting step, the second mounting step, the third mounting step;
- the first mounting step, the third mounting step, the second mounting step;
- the second mounting step, the first mounting step, the third mounting step;
- the second mounting step, the third mounting step, the first mounting step;
- the third mounting step, the first mounting step, the second mounting step;
- the third mounting step, the second mounting step, the first mounting step.

In a second variant of this first embodiment, the steps of the set of mounting steps are implemented together in a single brazing sequence. This second variant allows to simplify the assembly method and reduces the assembly time and cost.

Furthermore, in a third variant of the first embodiment, for the steps of the set of mounting steps, a brazing sequence is carried out for any two of the three mounting steps and another brazing sequence for the other mounting step.

Furthermore, in a second embodiment, said steps are implemented in the following order: the production step, the auxiliary mounting step, the set of mounting steps.

In a first variant of this second embodiment, the steps of the set of mounting steps are implemented sequentially, in one of the following orders:
- the first mounting step, the second mounting step, the third mounting step;
- the first mounting step, the third mounting step, the second mounting step;
- the second mounting step, the first mounting step, the third mounting step;
- the second mounting step, the third mounting step, the first mounting step;
- the third mounting step, the first mounting step, the second mounting step;
- the third mounting step, the second mounting step, the first mounting step.

In a second variant of this second embodiment, the steps in the set of mounting steps are implemented together in a single brazing sequence. This second variant allows to simplify the assembly method and reduces the assembly time and cost.

Furthermore, in a third variant of this second embodiment, for the steps of the set of mounting steps, one brazing sequence is carried out for any two of the three mounting steps and another brazing sequence for the other mounting step.

Furthermore, in a third embodiment, said steps are implemented in the following order: first the production step, then the auxiliary mounting step that is implemented during the set of mounting steps.

Advantageously, the auxiliary mounting step and the steps of the set of mounting steps are implemented successively, in one of the following orders:
- the first mounting step, the auxiliary mounting step, the second mounting step, the third mounting step;
- the first mounting step, the auxiliary mounting step, the third mounting step, the second mounting step;
- the first mounting step, the auxiliary mounting step, then the second mounting step and the third mounting step which are implemented in a single step.

BRIEF DESCRIPTION OF FIGURES

The figures of the attached drawing will make it clear how the invention can be carried out. In these figures, identical references designate similar elements.

FIGS. 3A, 3B, 3C, 4 and 5 represent different successive steps of an assembly method of a motherboard.

DETAILED DESCRIPTION

Figure 1:
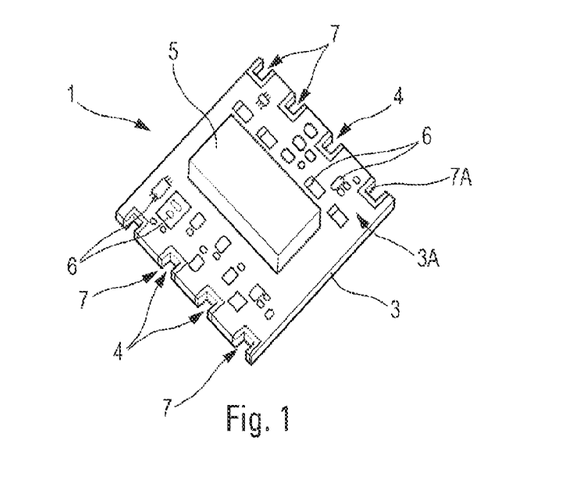
FIG. 1 is a schematic perspective view (top view) of a particular embodiment of a planar transformer.

The planar transformer 1, shown schematically in a particular embodiment in FIG. 1 and allowing to illustrate the invention, is intended to produce an (electrical) energy conversion, for example a direct/direct, direct/alternating or alternating/direct type voltage conversion.

Figure 2:
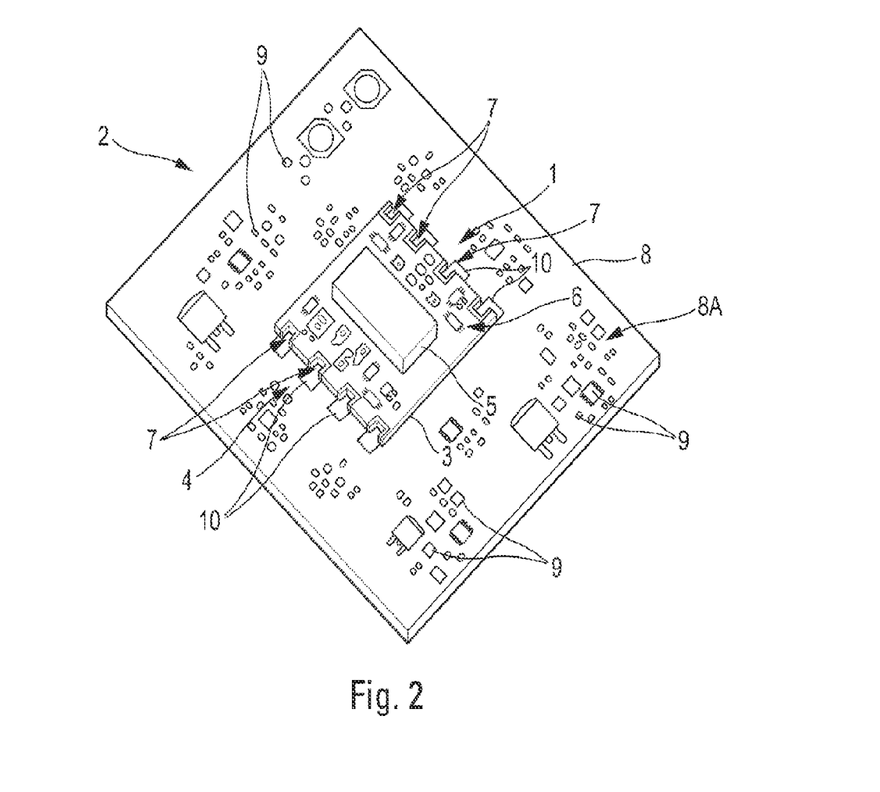
FIG. 2 is a schematic perspective view (top view) of a particular embodiment of a motherboard provided with the planar transformer of FIG. 1.

In the context of the present invention, this planar transformer 1 is intended to be mounted on a motherboard 2, as shown in FIG. 2.

Although not exclusively, this planar transformer 1 shown in FIG. 1 and/or this motherboard 2 shown in FIG. 2 can be used in equipment deployed in stationary installations or in onboard equipment on movable platforms. As an illustration, the planar transformer 1 and/or the motherboard 2 can be used in land, sea or air vehicles. They can also be used in weapon systems and in particular in missiles.

They can, in particular, be used in the power supply of calculators.

The planar transformer 1 comprises at least, as shown in FIG. 1:
- a printed circuit board 3. A bare printed circuit board (PCB) is an assembly consisting of an insulating support and flat metallic conductors intended to ensure electrical connections between electronic components that will be arranged on the surface of the support. The printed circuit board 3 is provided with turns (not shown) specified below. The printed circuit board 3 is also provided with a connection interface 4, at some of its ends, in particular so that it can be simply mounted on a motherboard 2 (receiver) by welding; and
- a magnetic core 5, preferably made of ferrite. The magnetic core 5 is mounted on the printed circuit board 3 in such a way as to cooperate, in the usual way, with the turns which are arranged around this magnetic core 5. The turns form one or more primary windings and one or more secondary windings, which cooperate (in the usual, known and not further described way) with the magnetic core 5 to form an (electrical) energy converter, e.g. a direct/direct, direct/alternating or alternating/direct type voltage converter.

The planar transformer 1 is produced according to a usual planar technology.

According to the invention, said planar transformer 1 further comprises at least one electronic component 6 mounted (in a usual, known and not further described way) on the printed circuit board 3.

In a preferred embodiment, said planar transformer 1 comprises a plurality of electronic components 6 mounted on the printed circuit board 3, as schematically shown in FIG. 1. Furthermore, in a particular embodiment of this preferred embodiment, the planar transformer 1 comprises as many electronic components 6 as possible, i.e. so as to occupy the entire surface of the (upper) face 3A, remaining available on the printed circuit board 3. The electronic components 6 are brazed (in the usual way) to the printed circuit board 3.

Preferably, the printed circuit board 3 comprises, in a usual way, a plurality of superimposed layers. The turns (not shown) are arranged on layers other than an upper layer, and preferably on the assembly of layers other than the upper layer, and said electronic components are arranged on said one upper layer (which is the one closest to the upper face 3A).

The upper layer of the printed circuit board 3 is therefore left without turns in order to be able to place electronic components 6 on the entire available surface (of the upper face 3A) around the magnetic core 5.

The printed circuit board 3 of the planar transformer 1 is thus produced in such a way as to be able to accommodate numerous electronic components 6, without increasing the surface area of the printed circuit board 3 required for routing the turns of the planar transformer 1.

The compactness thus obtained also allows to limit the electromagnetic disturbances, and the electronic components 6 placed on the printed circuit board 3 free space on the motherboard 2 which receives the planar transformer 1. This reduces the cost of manufacturing and assembling, as the solution is generic and reusable.

In a particular embodiment, the electronic component or components 6 are part of a power cell used for the operation of the planar transformer 1.

In addition, the connection interface 4 comprises one or more connection elements for attaching the planar transformer 1 to the motherboard 2, as specified below.

The connection interface 4 of the planar transformer 1 can be produced by any usual connection means. However, in one particular embodiment, the connection interface 4 comprises metallizations 7.

The planar transformer 1 can be used in various applications and be adapted to the constraints imposed by the environment of the electronic board (motherboard 2) on which it will be mounted.

It is known that the magnetic components, in particular the transformers, are major contributors to the size, volume, weight and cost of (switch mode) power supplies. Also, the planar transformer 1 can be used in compact and low cost power electronics equipment.

The planar transformer 1 can therefore be part of a motherboard 2 (or electronic board), as shown in FIG. 2. The motherboard 2 comprises, in this case, a printed circuit board 8, and a planar transformer 1 as described above, which is mounted on this printed circuit board 8.

The motherboard 2 furthermore comprises a plurality of electronic components 9 (shown schematically) which are also mounted (in the usual way) on the printed circuit board 8, at various points (on the upper face 8A) of the printed circuit board 8. Electronic components can also be mounted on the lower face (not shown) of the printed circuit board 8.

The planar transformer 1, as described above, allows to add electronic components 6 to the printed circuit board 3 without increasing its surface area. The electronic components 6 placed on the planar transformer 1 allow to save space on the receiving motherboard 2, in particular to receive other electronic components 9.

The motherboard 2 also comprises receiving ranges (or surfaces) 10 which allow the planar transformer 1 equipped with electronic components 6 to be received.

In the example shown in FIG. 2, the metallizations 7 (electrically conductive) of the planar transformer 1 equipped with the electronic components 6 are superimposed on the reception ranges 10 (electrically conductive) of the motherboard 2 so that the planar transformer 1 can be brazed on the motherboard 2.

Figure 6A:
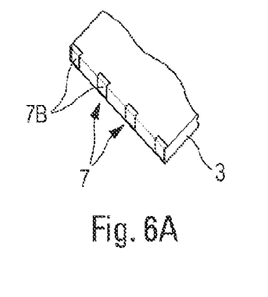
FIG. 6A is a schematic perspective view of a portion of the printed circuit board comprising metallizations of a connection interface, in accordance with a first variant embodiment.
Figure 6B:
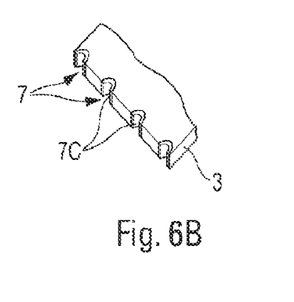
FIG. 6B is a schematic perspective view of a portion of the printed circuit board comprising metallizations of a connection interface, in accordance with a second variant embodiment.

The metallizations 7 can be produced in different ways. By way of illustration, the metallizations 7 can, for example, be produced:
- according to the embodiment 7A as shown in FIG. 1, with a square cross-section; or
- according to the embodiment 7B as shown in FIG. 6A, with a flat face; or
- according to the embodiment 7C shown in FIG. 6B, with a semi-circular cross-section.

As connection interfaces for the planar transformer 1, any connector can be provided that allows the planar transformer 1 to be brazed to the receiving motherboard 2. Connection interfaces without brazing are also possible.

The planar transformer 1, as described above, is configured to have an optimized overall dimension and to allow an easy mounting on an electronic board (motherboard 2), as specified below.

The motherboard 2 can be obtained using a (manufacturing and) assembly method such as those described below.

In the context of the present, said assembly method generally comprises at least the following steps (specified below):
- a production step to form a planar transformer comprising at least one printed circuit board provided with turns and a connection interface;
- a set of mounting steps comprising:
  - a. a first mounting step to mount electronic components on the printed circuit board of the planar transformer;
  - b. a second mounting step for mounting electronic components on the printed circuit board of a motherboard; and
  - c. a third mounting step to mount the planar transformer on a printed circuit board of a motherboard via the connection interface; and
- an auxiliary mounting step for mounting a magnetic core on the printed circuit board so as to cooperate with the turns.

In a first embodiment, said (manufacturing and) assembly method comprises, as shown in FIGS. 3A, 3B, 3C, 4 and 5, the following successive steps:
- the production step to form a planar transformer 1 comprising at least one printed circuit board 3 provided with turns and a connection interface 4;
- the auxiliary mounting step for mounting a magnetic core 5 arranged on the printed circuit board 3 so as to cooperate with the turns; and
- said set of mounting steps (comprising brazing operations) specified below.

Figure 3A:
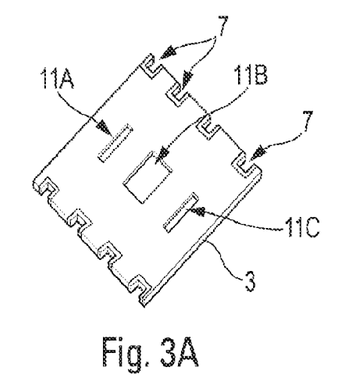
FIG. 3A is a schematic perspective view of a bare printed circuit board provided with openings.
Figure 3B:
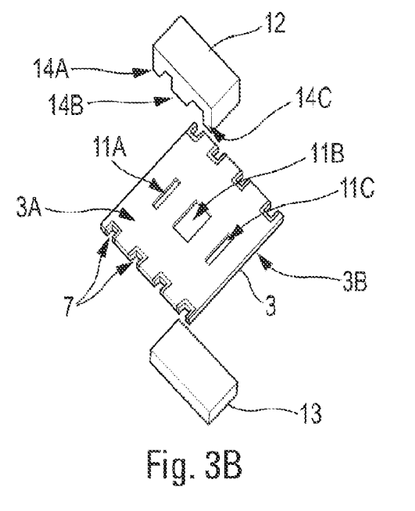
FIG. 3B is a schematic view, in perspective, of the printed circuit board of FIG. 3A and two elements (or portions) of a magnetic core.

Specifically:
- the production step consists in forming a printed circuit board 3 provided with openings 11A, 11B and 11C and metallizations 7, as shown in FIG. 3A, as well as with turns not shown; and
- the auxiliary mounting step consists in mounting a magnetic core 5 on this printed circuit board 3. In the example shown, the magnetic core 5 is formed by two elements 12 and 13, as shown in FIG. 3B.

Figure 3C:
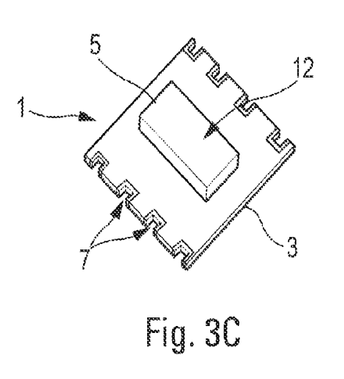
FIG. 3C is a schematic perspective view of the printed circuit board of FIG. 3B on which the magnetic core, formed of said two magnetic core portions, is mounted.

The element 12 is E-shaped with branches 14A, 14B and 14C. The element 12 is intended to be mounted on one face (upper face 3A) of the printed circuit board 3 such that the branches 14A, 14B and 14C pass through the openings 11A, 11B and 11C respectively. The (I-shaped) element 13 is brought to the lower face 3B (i.e., opposite the face 3A) of the printed circuit board 3 and is attached to the branches 14A, 14B and 14C of this element 12 (passing through the openings 11A, 11B and 11C) so as to obtain the core 5 mounted on the printed circuit board 3, as shown in FIG. 3C.

In the context of the present invention, any usual type of planar ferrite core can be used. Thus, the elements 12 and 13, instead of being a pair of elements of forms E and I, can have other possible forms, such as pairs of forms E and E, or ER or EQ cores.

Figure 4:
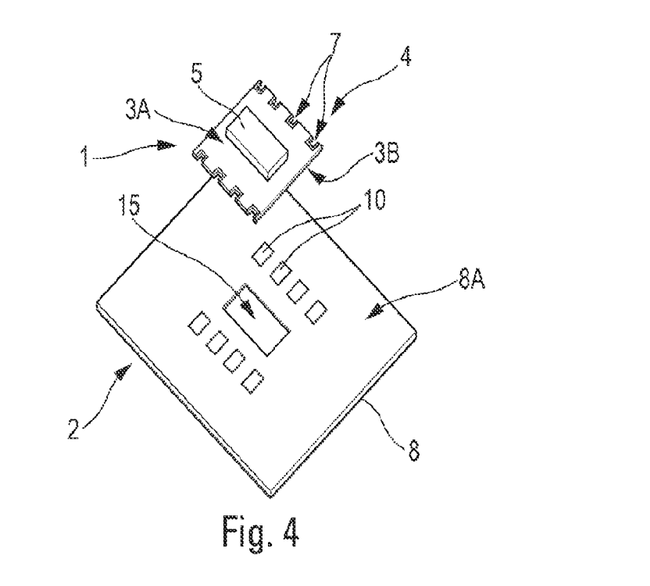
FIG. 4 is a schematic perspective view of the printed circuit board of FIG. 3C and a printed circuit board of a motherboard.
Figure 5:
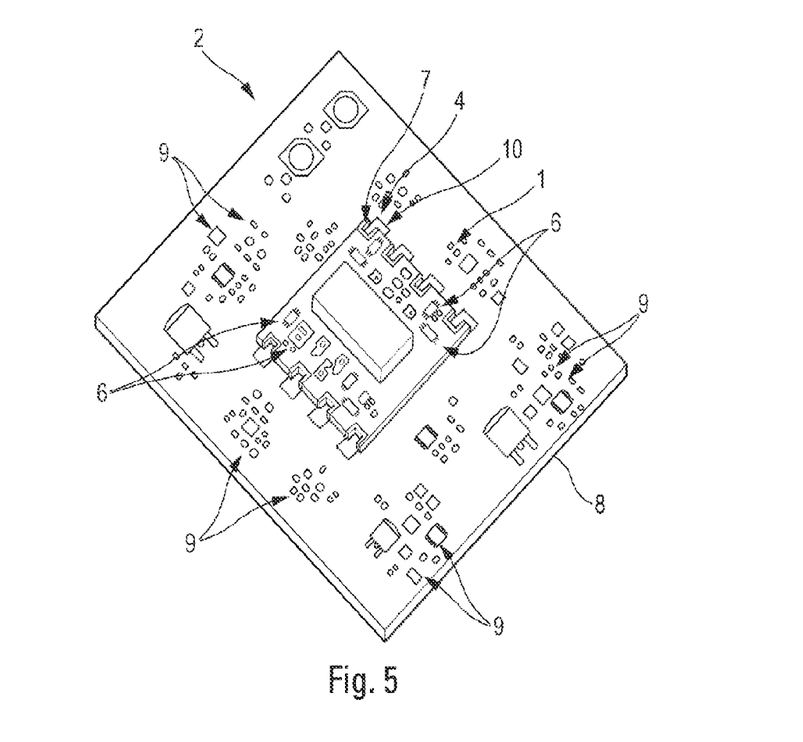
FIG. 5 is a view identical to FIG. 2 showing the assembled motherboard.

The set of mounting steps comprising:
- the first mounting step for mounting electronic components 6 on the printed circuit board 3 of the planar transformer 1;
- the second mounting step for mounting electronic components 9 on the printed circuit board 8 of the motherboard 2; and
- the third mounting step for mounting the planar transformer 1 on the printed circuit board 8 of the motherboard 2 via the connection interface 4. For this purpose, the printed circuit board 8 is provided (as shown in FIG. 4) with an opening 15 intended for receiving the element 13 of the magnetic core 5 of the planar transformer 1. The lower face 3B of the printed circuit board 3 is brought into contact with the upper side 8A of the printed circuit board 8 in such a way that the metallizations 7 of the printed circuit board 3 are superimposed on the receiving ranges 10 of the printed circuit board 8. The metallizations 7 (forming the connection interface 4) are brazed to the receiving ranges 10.

The usual steps of such an assembly method are known and are not described further below.

Preferably, in this first embodiment, the assembly method comprises a single brazing phase (for the set of mounting steps) during which the electronic components 6 of the planar transformer 1 are brazed onto its printed circuit board 3, the planar transformer 1 is brazed onto the printed circuit board 8 of the motherboard 2 and the electronic components 9 are brazed onto the printed circuit board 8 of the motherboard 2. This allows to avoid an additional operation (to assemble the motherboard 2) that exists in the prior art.

This preferred embodiment of the method therefore allows the motherboard 2 and the planar transformer 1 to be manufactured and assembled in a single brazing sequence (or phase). This method comprises a single phase of mounting the electronic components and a single phase of testing for the whole motherboard 2 (printed circuit board 8 and planar transformer 1). Thus, the manufacturing cost can be reduced.

It is also possible to produce a brazing sequence for any two of the three mounting steps and another brazing sequence for the other mounting step, regardless of the order of the mounting steps and regardless of the order of the brazing sequences (the two-step sequence can be carried out first or second).

In a variant of this first embodiment, the steps of the set of mounting steps are implemented sequentially in one of the following orders:
- the first mounting step, the second mounting step, the third mounting step;
- the first mounting step, the third mounting step, the second mounting step;
- the second mounting step, the first mounting step, the third mounting step;
- the second mounting step, the third mounting step, the first mounting step;
- the third mounting step, the first mounting step, the second mounting step;
- the third mounting step, the second mounting step, the first mounting step.

This variant embodiment allows to obtain the same motherboard 2 (with reduced overall dimension) as the one obtained with the above-mentioned preferred embodiment, but with several brazing steps.

According to one of the possibilities, the electronic components 6 of the planar transformer 1 are brazed onto the printed circuit board 3 of the planar transformer 1 firstly. Then, the assembled planar transformer 1 is brazed to the motherboard 2 (receiver), for example together with the electronic components 9 of this motherboard 2. The electronic components 6 of the planar transformer 1 are therefore subjected to a remelting.

Further in a second embodiment (not shown), said steps are implemented in the following order: the production step, the auxiliary mounting step, the set of mounting steps.

In a first variant of this second embodiment, the steps of the set of mounting steps are implemented sequentially, in one of the following orders:
the first step of mounting, the second step of mounting, the third step of mounting;
the first mounting step, the third mounting step, the second mounting step;
the second mounting step, the first mounting step, the third mounting step;
the second mounting step, the third mounting step, the first mounting step;
the third mounting step, the first mounting step, the second mounting step;
the third mounting step, the second mounting step, the first mounting step.

Furthermore, in a second variant of this second embodiment, the steps of the set of mounting steps are implemented together in a single brazing sequence. This second variant allows to simplify the assembly method and reduces the assembly time and cost.

It is also possible to produce a brazing sequence for any two of the three mounting steps and another brazing sequence for the other mounting step, regardless of the order of the mounting steps and regardless of the order of the brazing sequences (the two-step sequence can be carried first or second).

Furthermore, in a third embodiment (not shown), the assembly method steps are implemented in the following order:
firstly the production step;
and then the auxiliary mounting step which is implemented during the set of mounting steps.

In this third embodiment, the auxiliary mounting step and the steps of the set of mounting steps are implemented sequentially, in one of the following orders:
the first mounting step, the auxiliary mounting step, the second mounting step, the third mounting step;
the first mounting step, the auxiliary mounting step, the third mounting step, the second mounting step;
firstly the first mounting step, then the auxiliary mounting step, and finally the second mounting step and the third mounting step which are implemented together in a single (brazing) step.

The planar transformer 1 and/or the motherboard 2 and/or the manufacturing and assembly method, as described above, thus have many advantages, and in particular:
an overall dimension optimization. Indeed:
a. the surface of printed circuit board 3 intended for the turns of the planar transformer 1 is also used to place electronic components 6;
b. we gain surface area on the motherboard 2;
an improvement of the assembly method. The method is integrated by allowing to produced, in the same method, the equipped planar transformer 1 and its receiver board (i.e. said motherboard 2);
an improvement in the development method. Indeed, the planar transformer 1 and the motherboard 2 offer the advantages of a reusable physical power supply module (validation, routing, environments), without the disadvantages (additional cost of assembling the physical module in a separate industrial method such as daughterboard/motherboard);
a miniaturization with:

a. an optimization of the available surface for the electronic components; and
b. an integrated solution;
c. a generic character with:
d. a creation of low-cost reusable functions; and
e. a reusable solution; and
a simplification of the method, compared to independent physical modules, with a low serial cost.

What is claimed is:

1. A motherboard comprising:
a motherboard printed circuit board;
a plurality of electronic components mounted on the motherboard printed circuit board; and
a planar transformer mounted on the motherboard printed circuit board, the planar transformer comprising:
a printed circuit board comprising turns;
a connection interface;
a magnetic core arranged on the printed circuit board to cooperate with the turns;
a plurality of electronic components mounted on the printed circuit board; and
a plurality of superimposed layers, wherein the turns are arranged on the plurality of superimposed layers other than an upper layer, and wherein the plurality of electronic components are arranged on the upper layer so as to occupy an entirety of the upper layer of the remaining available on the printed circuit board.

2. The motherboard according to claim 1, wherein the electronic component mounted on the printed circuit board is part of a power cell used for the operation of the planar transformer.

3. The motherboard according to claim 1,
wherein the connection interface comprises metallizations.

4. A method for assembling a motherboard according to claim 1, the method comprising the following steps:
a production step to form the planar transformer comprising at least one printed circuit board comprising turns and a connection interface;
a set of mounting steps comprising:
a first mounting step for mounting the electronic component on the printed circuit board of the planar transformer;
a second mounting step for mounting electronic components on the motherboard printed circuit board;
a third mounting step for mounting the planar transformer on the motherboard printed circuit board via the connection interface; and
an auxiliary mounting step for mounting the magnetic core on the printed circuit board of the planar transformer so as to cooperate with the turns.

5. The method for assembling a motherboard of claim 4, wherein the steps are implemented in the following order: the production step, the set of mounting steps, the auxiliary mounting step.

6. The method for assembling a motherboard of claim 5,
wherein the steps of the set of mounting steps are implemented successively, according to one of the following orders:
the first mounting step, the second mounting step, the third mounting step;
the first mounting step, the third mounting step, the second mounting step;
the second mounting step, the first mounting step, the third mounting step;

the second mounting step, the third mounting step, the first mounting step;

the third mounting step, the first mounting step, the second mounting step;

the third mounting step, the second mounting step, the first mounting step.

7. The method for assembling a motherboard of claim 5, wherein the steps of the set of mounting steps are implemented together in a single brazing sequence.

8. The method for assembling a motherboard of claim 7, wherein, for the steps of the set of mounting steps, a brazing sequence is carried out for any two of the three mounting steps and another brazing sequence for the other mounting step.

9. The method for assembling a motherboard of claim 4, wherein the steps are implemented in the following order: the production step, the auxiliary mounting step, the set of mounting steps.

10. The method for assembling a motherboard of claim 9, wherein the steps of the set of mounting steps are implemented successively, according to one of the following orders:

the first mounting step, the second mounting step, the third mounting step;

the first mounting step, the third mounting step, the second mounting step;

the second mounting step, the first mounting step, the third mounting step;

the second mounting step, the third mounting step, the first mounting step;

the third mounting step, the first mounting step, the second mounting step;

the third mounting step, the second mounting step, the first mounting step.

11. The method for assembling a motherboard of claim 10, wherein the steps of the set of mounting steps are implemented together in a single brazing sequence.

12. The method for assembling a motherboard of claim 10, wherein, for the steps of the set of mounting steps, a brazing sequence is carried out for any two of the three mounting steps and another brazing sequence for the other mounting step.

13. The method for assembling a motherboard of claim 4, wherein the steps are implemented in the following order: first the production step, then the auxiliary mounting step which is implemented during the set of mounting steps, and in that the auxiliary mounting step and the steps of the set of mounting steps are implemented successively, in one of the following orders:

the first mounting step, the auxiliary mounting step, the second mounting step, the third mounting step;

the first mounting step, the auxiliary mounting step, the third mounting step, the second mounting step;

the first mounting step, the auxiliary mounting step, then the second mounting step and the third mounting step which are implemented in a single step.

14. The motherboard according to claim 1, wherein the printed circuit board comprises a plurality of superimposed layers, wherein the turns are arranged on the plurality of superimposed layers other than an upper layer, and wherein the plurality of electronic components are arranged on the upper layer.

15. The motherboard according to claim 14, wherein the plurality of electronic components mounted on the printed circuit board are part of a power cell used for the operation of the planar transformer.

16. The motherboard according to claim 14, wherein the connection interface comprises metallizations.

17. A method for assembling a motherboard according to claim 1, the method comprising the following steps:

a production step to form the planar transformer comprising at least one printed circuit board comprising turns and a connection interface;

a set of mounting steps comprising:

a first mounting step for mounting the electronic component on the printed circuit board of the planar transformer;

a second mounting step for mounting electronic components on the motherboard printed circuit board;

a third mounting step for mounting the planar transformer on the motherboard printed circuit board via the connection interface; and an auxiliary mounting step for mounting the magnetic core on the printed circuit board of the planar transformer so as to cooperate with the turns.

18. The method for assembling a motherboard of claim 17, wherein the steps are implemented in the following order: the production step, the set of mounting steps, the auxiliary mounting step.

* * * * *